(12) United States Patent
Takayanagi et al.

(10) Patent No.: US 7,372,495 B2
(45) Date of Patent: May 13, 2008

(54) CMOS APS WITH STACKED AVALANCHE MULTIPLICATION LAYER AND LOW VOLTAGE READOUT ELECTRONICS

(75) Inventors: Isao Takayanagi, Tokyo (JP); Junichi Nakamura, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 755 days.

(21) Appl. No.: 10/226,190

(22) Filed: Aug. 23, 2002

(65) Prior Publication Data

US 2004/0036786 A1 Feb. 26, 2004

(51) Int. Cl.
  *H04N 5/225* (2006.01)
  *H04N 3/14* (2006.01)
  *H04N 5/335* (2006.01)
  *H01L 31/107* (2006.01)
  *H01L 27/00* (2006.01)

(52) U.S. Cl. .................. 348/314; 348/217.1; 348/299; 348/301; 348/310; 257/438; 250/208.1

(58) Field of Classification Search ................ 348/248, 348/299, 300–301, 307–310, 314, 216.1, 348/217.1; 257/438
See application file for complete search history.

(56) References Cited

U.S. PATENT DOCUMENTS

| | | | |
|---|---|---|---|
| 4,973,833 A | 11/1990 | Takada et al. | |
| 5,181,092 A * | 1/1993 | Atsumi | 257/361 |
| 5,371,392 A | 12/1994 | Isono et al. | |
| 5,557,121 A * | 9/1996 | Kozuka et al. | 257/292 |
| 5,684,323 A * | 11/1997 | Tohyama | 257/363 |
| 5,818,052 A * | 10/1998 | Elabd | 250/370.09 |
| 5,892,222 A * | 4/1999 | Elabd | 250/226 |
| 6,437,339 B2 * | 8/2002 | Lee et al. | 250/370.09 |
| 6,741,283 B1 * | 5/2004 | Merrill et al. | 348/308 |
| 6,936,806 B1 * | 8/2005 | Kitamura et al. | 250/208.1 |
| 2001/0045535 A1 | 11/2001 | Yasuda | |
| 2002/0089595 A1 * | 7/2002 | Orava et al. | 348/302 |

FOREIGN PATENT DOCUMENTS

EP 1187217 A2 3/2002

OTHER PUBLICATIONS

Klaas Bult, "Analog Broadband Communication Circuits in Pure Digital Deep Sub-Micron CMOS," ISSCC Dig. Tech. Papers, pp. 76-77, Feb. 1999.
Zhong-Shou Huang and Takao Ando, "A Novel Amplified Image Sensor with a-Si:H Photoconductor and MOS Transistors," IEEE Transaction on Electron Devices, vol. 37, No. 6, Jun. 1990, pp. 1432-1438.

(Continued)

*Primary Examiner*—John Villecco
*Assistant Examiner*—Dan Pasiewicz
(74) *Attorney, Agent, or Firm*—Dickstein Shapiro LLP (57) ABSTRACT

An image sensor includes a pixel having a protection circuit connected to a charge multiplying photoconversion layer. The protection circuit prevents the pixel circuit from breaking down when the voltage in the pixel circuit reaches the operating voltage applied to the charge multiplying photoconversion layer in response to the image sensor being exposed to a strong light. The protection circuit causes additional voltage entering the pixel circuit from the charge multiplying photoconversion layer over a predetermined threshold voltage level to be dissipated from the storage node and any downstream components.

33 Claims, 6 Drawing Sheets

OTHER PUBLICATIONS

Isao Takayanagi et al., "Amplified MOS Imager for Soft X-ray Imaging," IEEE Transactions on Electron Devices, vol. 42, No. 8, Aug. 1995, pp. 1425-1431.

Hon-Sum Wong, "Technology and Device Scaling Considerations for CMOS Imagers," IEEE Transactions on Electron Devices, vol. 43, No. 12, Dec. 1996, pp. 2131-2142.

Wug-Dong Park et al., "An a-Se HARP Layer for a Solid-state Image Sensor," IEEE Workshop on Charge-Coupled Devices and Advanced Image Sensors, Jun. 1999, pp. 56-59.

Isao Takayanagi et al., "A Stacked CMOS APS for Charge Particle Detection and its Noise Performance," IEEE Workshop on Charge-Coupled Devices and Advanced Image Sensors, Jun. 1999, pp. 159-162.

Toshihisa Watabe et al., "CMOS Image Sensor overlaid with a HARP Photoconversion Layer," Program of 1999 IEEE Workshop on Charge-Coupled Devices and Advanced Image Sensors, pp. 211-214.

Yamauchi, M., et al. CMOS Image Sensor Overlaid With a Harp Photo-Conversion Film, 2000 IEEE (89-92).

* cited by examiner

CMOS APS WITH STACKED AVALANCHE MULTIPLICATION LAYER AND LOW VOLTAGE READOUT ELECTRONICS

FIELD OF THE INVENTION

The present invention relates to image sensors which use a stacked avalanche multiplication layer to amplify the intensity of light captured by a pixel circuit.

BACKGROUND OF THE INVENTION

Amid the rising popularity for digital image devices such as digital cameras is a demand for increasingly higher picture resolution and for increasingly compact designs of such devices. Due to the interior space constraints in the housings of the compact designs, it is necessary to reduce the sizes of the electronic circuits in the device, including the image sensor. However, upon shrinking the size of the image sensor, a tradeoff must be made between resolution and the signal levels outputted from the image sensor. If the resolution is kept the same upon reducing the size of the image sensor, the size of each pixel must be proportionately reduced. Smaller pixels reduce the amount of charge that can be collected by each pixel during image exposure, which in turn reduces the sensitivity of the image sensor. Although the reduced sensitivity effect can be offset by increasing the integration (exposure) time, this is an undesirable "solution" because increasing integration time also increases the potential for obtaining a blurred image if there is any movement by the image subject or the device during exposure. On the other hand, in order to maintain the same sensitivity without having to increase integration time, the pixels must be made larger, which limits the resolution.

Figure 1A:
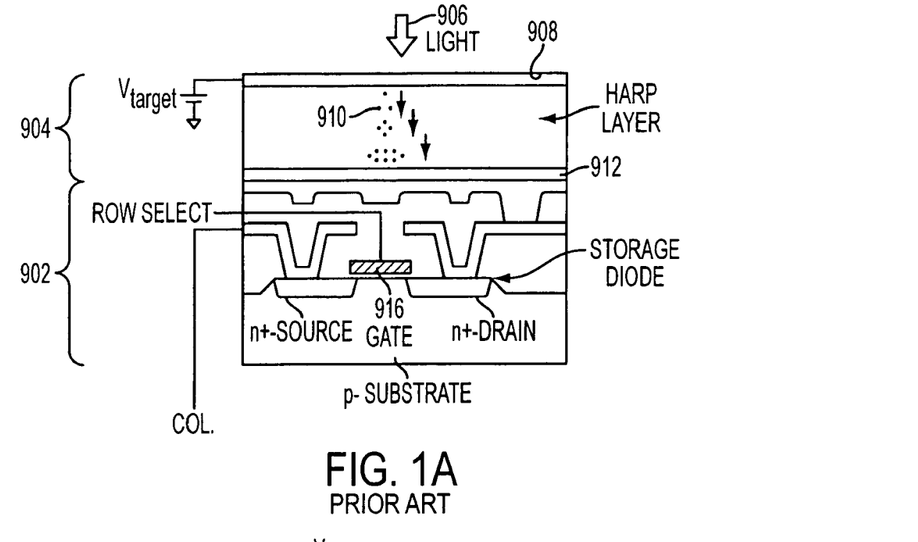
FIG. 1A is a cross-sectional view of a pixel in an image sensor having a charge multiplying photoconversion layer as known in the art.
Figure 1B:
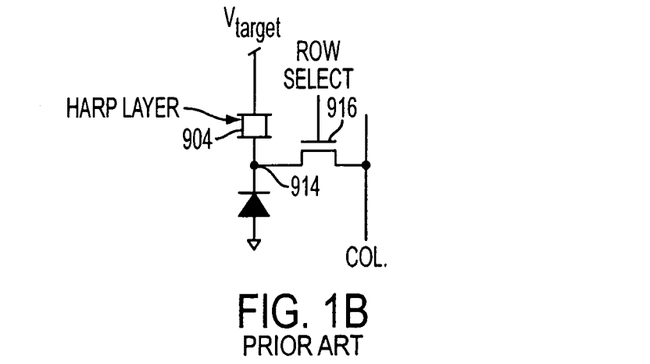
FIG. 1B is a circuit diagram of the pixel arrangement shown in FIG. 1A.

One solution towards achieving both a more compact size and high image quality is disclosed in "CMOS Image Sensor Overlaid with a HARP Photoconversion Layer," by T. Watabe, et al., published in the Program of the 1999 IEEE Workshop on Charge-Coupled Devices and Advanced Image Sensors, pp. 211-214. In this image sensor, which is shown in FIGS. 1A and 1B, the pixel circuit 902 is overlaid with a stacked charge multiplying photoconversion layer, such as a high-gain avalanche rushing amorphous photoconductor ("HARP") photo-conversion layer 904 for amplifying the light signal produced by each pixel.

When a photon 906 hits the upper surface 908 of the HARP layer 904, a charge 910 in the form of holes is generated and amplified to many times its original level while being propelled through the HARP layer 904 to the bottom side 912. The pixel circuit 902 is electrically connected to the bottom side 912 of the HARP layer 904 such that the amplified light signal 910, upon reaching the bottom side 912 of HARP layer 904, is conducted into the pixel circuit 902 as electrical charge. The charge accumulates at a storage node 914 in the pixel circuit until the pixel data is read out by activating the gate of a row select switch 916. The amount of charge accumulated at the node 914, which is proportional to the intensity of light 906 detected, is read out. In this manner, the image sensor of FIGS. 1A and 1B allows each pixel to capture image data with an intensity and sensitivity equivalent to that attainable by significantly larger pixels which do not have the avalanche multiplication capability. As a result, use of a HARP layer enables the image quality to be improved without having to increase the size of the image sensor array.

In order to obtain avalanche multiplication in the HARP layer, an electric field of about $10^6$ V/cm is required, which is achieved by applying an operating voltage of between 50-100 V to the HARP layer. In a typical HARP image sensor, voltages of less than about 8 V are used in the pixel circuit connected beneath the HARP layer, with the pixel circuit generally having a breakdown voltage of around 20 V. When the intensity of the incident light on the image sensor is at the upper end of the detection range for the charge multiplying photoconversion layer, the voltage level accumulating at the storage diode beneath the HARP layer approaches the level of the operating voltage applied to the HARP layer. Thus, voltages of 50-100 V may be applied to the storage diode when the image sensor is exposed to a strong light, resulting in a breakdown of the readout components of the pixel circuit.

Figure 2:
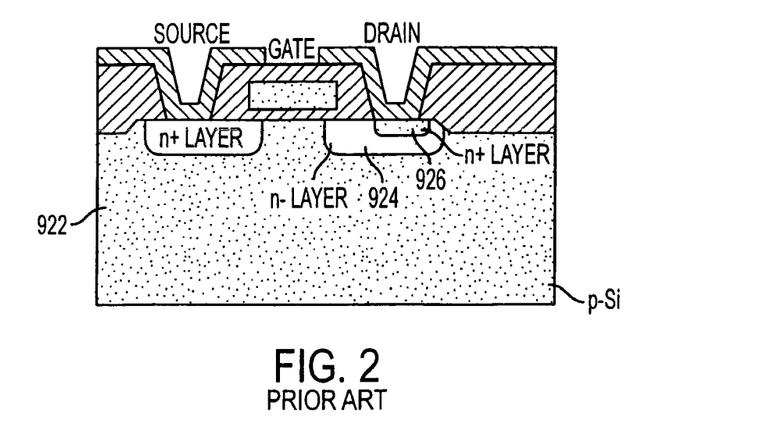
FIG. 2 is a cross-sectional view of a double-drain MOS transistor as known in the art.

To address this problem, attempts have been made to build a pixel circuit having a higher breakdown tolerance. An example of such a high tolerance pixel circuit is disclosed in the article by T. Watabe et al. mentioned above, in which the pixel circuit is constructed as MOS transistor having a double drain structure. This structure is shown in FIG. 2, in which the n-doped drain formed in the p-doped silicon layer 922 includes a low-dose n– region 924 surrounding a conventional high-dose n+ region 926. The double drain MOS transistor structure was shown to achieve an endurance voltage up to just under 60 V. However, a special MOS fabrication process is required for forming the double drain MOS transistor, and the size of the MOS transistor makes it difficult to attain small pixel sizes for high resolution image sensors.

BRIEF SUMMARY OF THE INVENTION

The present invention mitigates problems of the high voltages which may be generated by a HARP layer under bright light conditions by incorporating a protection circuit into the pixel circuit connected to the HARP layer. The protection circuit prevents the pixel circuit from breaking down when the voltage in the pixel circuit reaches the operating voltage applied to the charge multiplying photoconversion layer in response to the image sensor being exposed to a strong light. In particular, the protection circuit of the present invention may be designed in any of several configurations in which additional voltage entering the pixel circuit from the charge multiplying photoconversion layer over a predetermined threshold voltage level is dissipated before reaching the storage node and other lower voltage components downstream therefrom.

These and other features and advantages of the present invention will become more apparent from the following detailed description of the invention which is provided with reference to the accompanying drawings.

DETAILED DESCRIPTION OF THE INVENTION

Figure 3:
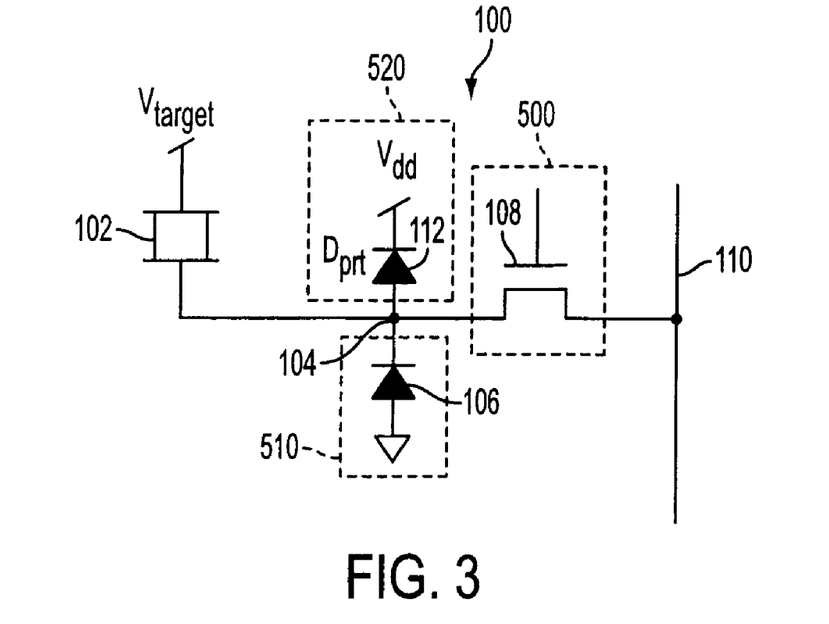
FIG. 3 is a circuit diagram of a first preferred embodiment in accordance with the present invention.

A first preferred embodiment of the present invention is shown in FIG. 3, and is similar to the pixel arrangement shown in FIG. 1B in that it includes a charge (hole) multiplying photoconversion layer 102 connected to a voltage $V_{target}$ at its upper plate and connected to storage node 104 of a storage element 510 at its bottom plate. In this embodiment, storage element 510 is provided as a storage diode 106. Although the charge multiplying photoconversion layer is preferably a high-gain avalanche rushing amorphous photoconductor (HARP) photoconversion layer, other structures for detecting and performing photoconversion of a light signal and subsequently or simultaneously amplifying the resulting electrical charge may be used. Storage node 104 is the cathode of storage diode 106 for accumulating charge corresponding to image data being collected during the image sensor integration time. An output circuit 500 is connected to and positioned downstream from node 104, for reading out the charge accumulated at storage diode 106. As shown in FIG. 3, output circuit 500 may be simply constructed as a row select transistor 108.

The anode of storage diode 106 is connected to ground so as to block current flow through diode 106 when the voltage at node 104 is a higher level than the ground connection, which will always be the case when an image signal is received from the charge multiplying photoconversion layer 102, since the signal charges are holes. Thus, with respect to storage diode 106, therefore, as long as the row select transistor 108 is open, charge flowing from charge multiplying photoconversion layer 102 as a result of the detection of light will accumulate at node 104.

Row select transistor 108 of output circuit 500 is connected to a column readout line 110 so that when the gate for the row select transistor 108 is closed, the charge at storage node 104 is transferred to the column readout line 110. When the column line containing the relevant pixel is activated, the image data from the pixel is transferred out of the pixel circuit 100 into an image processor where that charge is translated into image data along with the data read out from the other pixels in the image sensor array, to thereby construct the output image.

In order to prevent the charge accumulating at node 104 from reaching the breakdown point of storage diode 106 or row select transistor 108, a protection circuit 520 comprising a protection diode 112, the anode of which is connected to node 104 of storage diode 106. The cathode of protection diode 112 is connected to a voltage $V_{dd}$, So that when the voltage level at storage node 104 reaches the level of $V_{dd}$, any additional voltage arriving from the charge multiplying photoconversion layer 102 is bled off away from node 104 toward the voltage source $V_{dd}$. In this manner, protection diode 112 serves to limit the voltage at node 104 to $V_{dd}$.

Once voltage is bled off from node 104 through protection diode 112, image data representing light intensities detected at the upper end of the capability range of charge multiplying photoconversion layer 102 will be lost. Thus, the voltage level at source $V_{dd}$ should be set to strike a balance between minimizing the potential to lose image data acquired in the upper end of the detection range of layer 102, and limiting the voltage at node 104 to a comfortable level to avoid the risk of breakdown of the storage diode 106 and the row select transistor 108.

Figure 4:
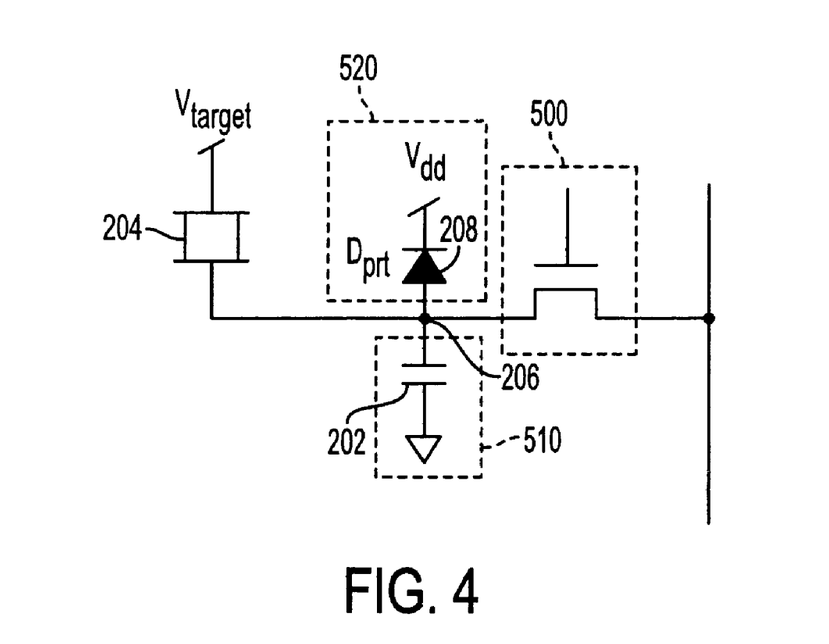
FIG. 4 is a circuit diagram of a second preferred embodiment in accordance with the present invention.

A second preferred embodiment of the present invention is shown in FIG. 4, and is identical to the pixel circuit of the first embodiment except that the storage element 510 is embodied as a storage capacitor 202 instead of a storage diode. Preferably, storage capacitor 202 has a large capacitance value per unit area, even more preferably in the range of 2-5 $fF/\mu^2$. Such a capacitor provides a higher capacitance value while reducing the space required for the charge storage region, relative to the use of a storage diode.

In this embodiment, charge from the charge multiplying photoconversion layer 204 is stored in the capacitor 202, until the voltage at the capacitor 206 reaches $V_{dd}$. Additional voltage flowing to node 206 from the charge multiplying photoconversion layer 204 is then directed through the protection diode 208 of protection circuit 520 so that the charge stored in the capacitor 202 maintains a voltage of around $V_{dd}$.

Figure 5:
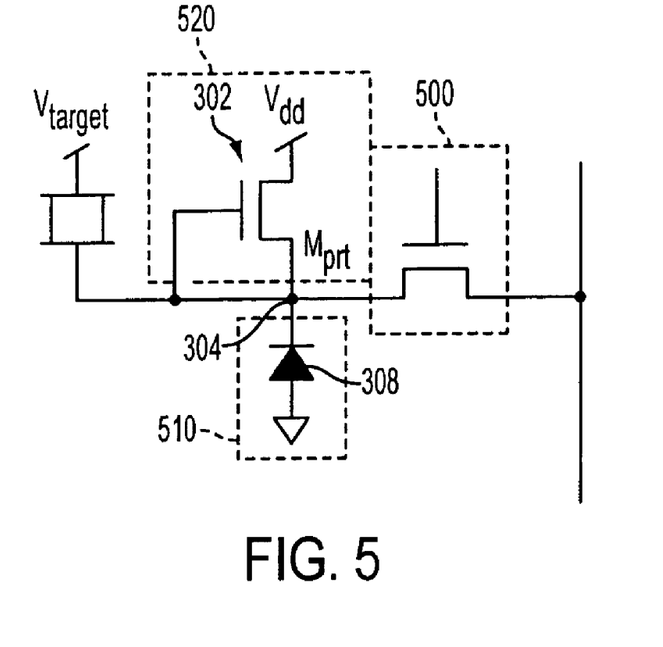
FIG. 5 is a circuit diagram of a third preferred embodiment in accordance with the present invention.

A third preferred embodiment of the present invention, as shown in FIG. 5, is identical to the pixel circuit of the first embodiment, except that the protection diode of the protection circuit 520 is replaced with an n-MOS transistor 302. Both the drain and the gate of the transistor 302 are connected to the storage diode 308 of storage element 510, and the source of the transistor 302 is connected to a voltage potential of $V_{dd}$.

As in the embodiments described previously, charge from the image signal accumulates at the storage node 304 until the voltage at node 304 reaches and surpasses $V_{dd}$. Once this occurs, the higher voltage at the transistor drain causes the excess voltage to flow through the transistor, so that the voltage at the storage node 304 remains around $V_{dd}$.

In a variant of this embodiment, the storage diode 308 of storage element 510 may be replaced with the high capacity capacitor as described above with reference to the embodiment of FIG. 4.

Figure 6:
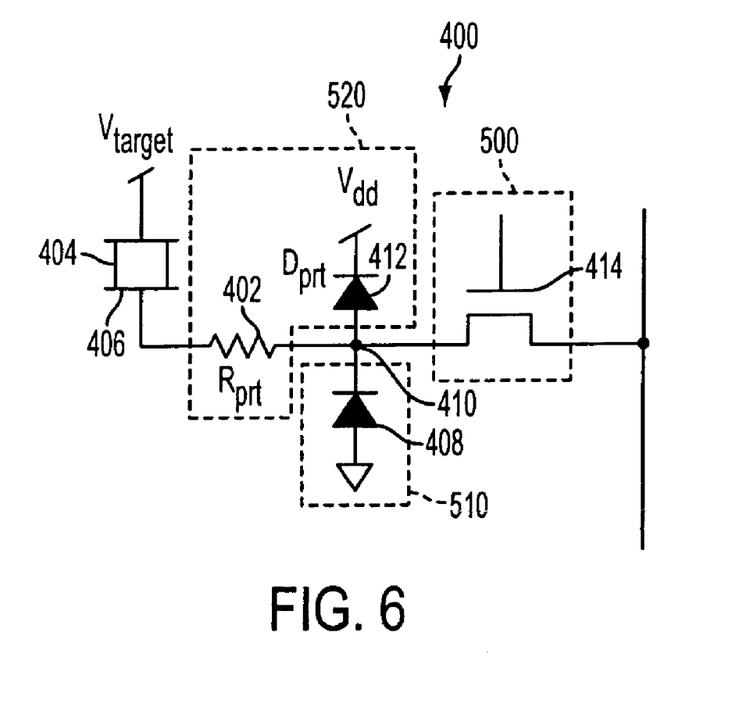
FIG. 6 is a circuit diagram of a fourth preferred embodiment in accordance with the present invention.

FIG. 6 shows a fourth preferred embodiment of the present invention, which is identical to the embodiment of FIG. 3 except that the protection circuit 520 further includes a resistor 402 positioned between the bottom plate 406 of the charge multiplying photoconversion layer 404 and the storage diode 408 of storage element 510. The resistor preferably has a high resistance value which reduces the voltage passing through the pixel circuit 400 from the charge multiplying photoconversion layer 404 and the storage diode 408 at node 410.

The presence of protection circuit 520, embodied here as protection diode 412, provides additional protection for the pixel circuit 400, so that in the event the signal voltage flowing from the charge multiplying photoconversion layer 404 is significantly larger than $V_{dd}$ that the voltage at node 410 upon passing through resistor 402 is still too high, the excess voltage will be directed away from the storage diode 408 and the row select transistor 414 through the protection diode 412.

A first variation of the FIG. 6 embodiment may be provided by replacing the storage diode 408 of storage element 510 with the capacitor discussed above in the embodiment of FIG. 4. Similarly, the present invention also encompasses a second variation of this embodiment in which the protection diode 412 is replaced with an n-MOS transistor as described above in the embodiment of FIG. 5. In a third variation of the FIG. 6 embodiment, both the storage diode 408 of storage element 510 and the protection diode 412 are replaced with the capacitor of FIG. 4 and the n-MOS transistor of FIG. 5, respectively.

In an image sensor using a charge multiplying photoconversion layer, as the voltage level at the storage node rises, the effective voltage applied to the photoconversion layer decreases, which affects the charge amplification function of the photoconversion layer. For example, if the voltage $V_{target}$ applied to the charge multiplying photoconversion layer is reduced, the amplification achieved by the photoconversion layer is also reduced. Thus, when the signal level is read out upon activating the row select switch, the signal level recorded by the imaging device will be less than the signal level actually detected.

The fifth through seventh embodiments of the present invention, described below with reference to FIGS. 7-9, address this concern. Each of the fifth through seventh embodiments is constructed by replacing the output circuit 500 in any of the embodiments shown in FIGS. 3-6, with the respective circuit shown in FIGS. 7-9.

Figure 7:
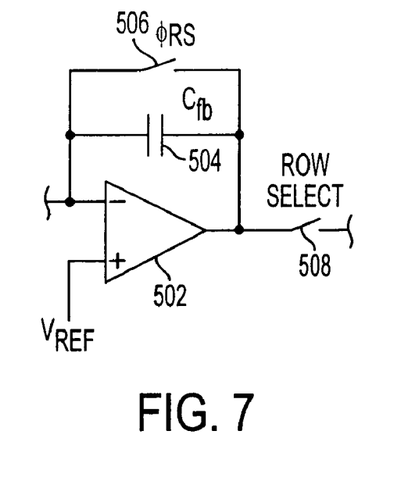
FIG. 7 is a relevant portion of a circuit diagram in accordance with a fifth embodiment of the present invention.

According to the fifth embodiment of the present invention, as shown in FIG. 7, a differential amplifier 502 is connected to a constant voltage supply $V_{ref}$ at a positive input thereof, and the output is connected to a capacitor 504 in a feedback loop connecting to the negative input to the differential amplifier. A reset switch 506 is connected in parallel to the capacitor 504 between the negative input and the output of the differential amplifier 502 for shorting out the capacitor 504. A row select switch 508, which may be identical to the row select transistor 108 discussed above with reference to FIG. 3, is also connected to the output of the differential amplifier downstream of the connection to the capacitor 504.

During the integration time in this embodiment, hole current from the charge (hole) amplifying photoconversion layer is inputted to the negative input of the differential amplifier, through the differential amplifier and through the feedback loop. In this manner, the hole current from the photoconversion layer is integrated on the feedback capacitor 504. The output voltage of the differential amplifier is inversely linearly proportional to the intensity of incident light on the photoconversion layer in that as the intensity of light detected by the photoconversion layer increases, the output voltage from the differential amplifier decreases. When the row select switch 508 is closed, the output voltage of the differential amplifier 502 is read out.

The differential amplifier 502 together with the feedback loop solves the problem of the decreasing amplification in the charge multiplying photoconversion layer by fixing the negative input voltage to the differential amplifier 502 at $V_{ref}$, which in turn maintains the effective operating voltage $V_{target}$ of the charge multiplying photoconversion layer at a constant level. If no protection circuit 520 is provided as described above, when the intensity of light exceeds a normal operation level of the output circuit, the output voltage of the differential amplifier falls below its normal operation level, and the differential amplifier and the feedback loop lose the ability to function properly. In this case, the hole current begins to accumulate at the negative input to differential amplifier as a parasitic capacitance value, and the voltage thereat begins rising towards the level of $V_{target}$.

The presence of the protection circuit 520 between the negative input to the differential amplifier 502 and the photoconversion layer in accordance with the present invention thus serves to prevent the output voltage of the differential amplifier falls below its normal operation level by diverting current from the photoconversion layer above the normal level and transferring the excess current through the protection circuit away from the differential amplifier. As described with respect to embodiments of FIGS. 3-6 above, the protection circuit 520 may be constructed as a protection diode, an n-MOS transistor, a resistor and a protection diode, or a resistor and an n-MOS transistor.

Since the intensity of light detected by the photoconversion layer is represented by the voltage of the output signal of the differential amplifier 502 and is integrated in the feedback loop during the integration time, it is not necessary to provide the storage circuit 510 in this embodiment. The presence or absence of the storage circuit 510 does not impact the operation of the pixel circuit, because the voltage at the negative input node of the differential amplifier 502 is fixed at $V_{ref}$. In the event that the intensity of detected light exceeds the normal operation level of output circuit 500, however, the presence of the storage circuit 510 serves as an accumulation point along the path between the photoconversion layer and the negative input of the differential amplifier from which the excess current can be bled off through the protection circuit 520.

Figure 8:
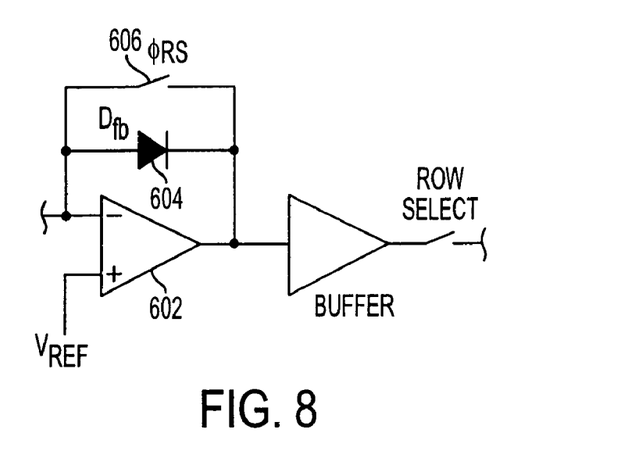
FIG. 8 is a relevant portion of a circuit diagram in accordance with a sixth embodiment of the present invention.

The output circuit according to the sixth embodiment is shown in FIG. 8, and is identical to the output circuit of FIG. 7, except that the output circuit of FIG. 8 converts the hole current from the charge amplifying photoconversion layer into a logarithmic signal, to account for the decreasing amplification level of the charge multiplying photoconversion layer due to the inverse relationship between the voltage level at the storage node and the effective $V_{target}$. In this regard, instead of a capacitor connected between the negative input and the output of the differential amplifier as shown in FIG. 7, the output circuit of FIG. 8 provides a feedback diode 604 having its anode connected to the negative input of the differential amplifier 602 and its cathode connected to the output of the differential amplifier 602. As configured in this manner, the output circuit of this embodiment thus logarithmically compresses the readout signal representing the intensity of the detected light.

Figure 9:
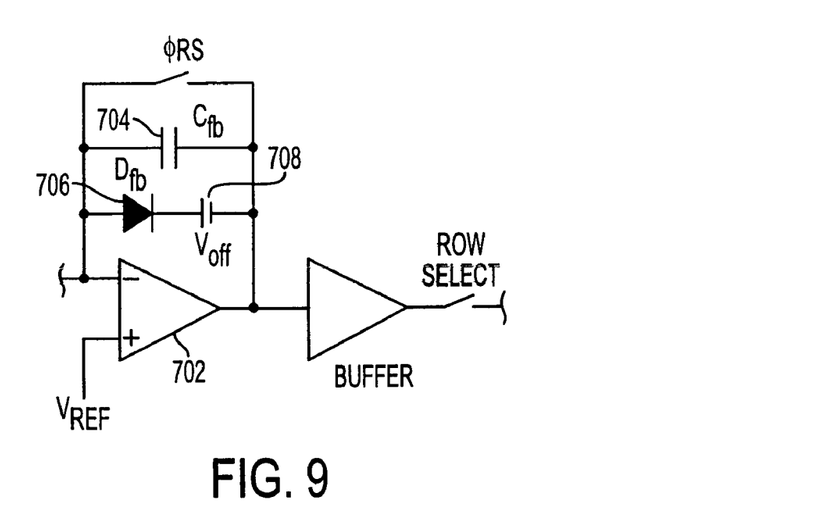
FIG. 9 is a relevant portion of a circuit diagram in accordance with a seventh embodiment of the present invention.

As shown in FIG. 9, the output circuit of the seventh embodiment essentially combines the output circuits of FIGS. 7 and 8, to thereby provide linear output signals in low light conditions and logarithmic output signals in brighter light conditions. Specifically, in this output circuit, a capacitor 704 is connected in parallel with a feedback diode 706 in a feedback loop connected between the output of the differential amplifier 702 and the negative input thereto. Capacitor 704 is similar to capacitor 504 discussed above with reference to FIG. 7, and feedback diode 706 is similar to the feedback diode 604 discussed above with reference to FIG. 8.

Referring still to FIG. 9, an offset voltage $V_{off}$ (708) is connected between the output of the differential amplifier 702 and the cathode of the feedback diode 706 to switch the pixel readout signals from a linear output to a logarithmic output, with the switching point defined by $V_{off}$. Optionally, the switching point can be made adjustable by replacing the voltage $V_{off}$ with a capacitor, wherein $V_{off}$ is then selectively supplied to the capacitor 704 via a switch connected to a node between the feedback diode 706 and the capacitor 704.

More detailed descriptions of the output circuits shown in FIGS. 7-9 are provided in related U.S. application Ser. No. 10/226,326 entitled "A CMOS APS WITH STACKED AVALANCHE MULTIPLICATION LAYER WHICH PROVIDES LINEAR AND LOGARITHMIC PHOTO-CONVERSION CHARACTERISTICS," the disclosure of which is hereby incorporated by reference, and which is commonly owned with and has the same inventorship as the present application.

Figure 10:
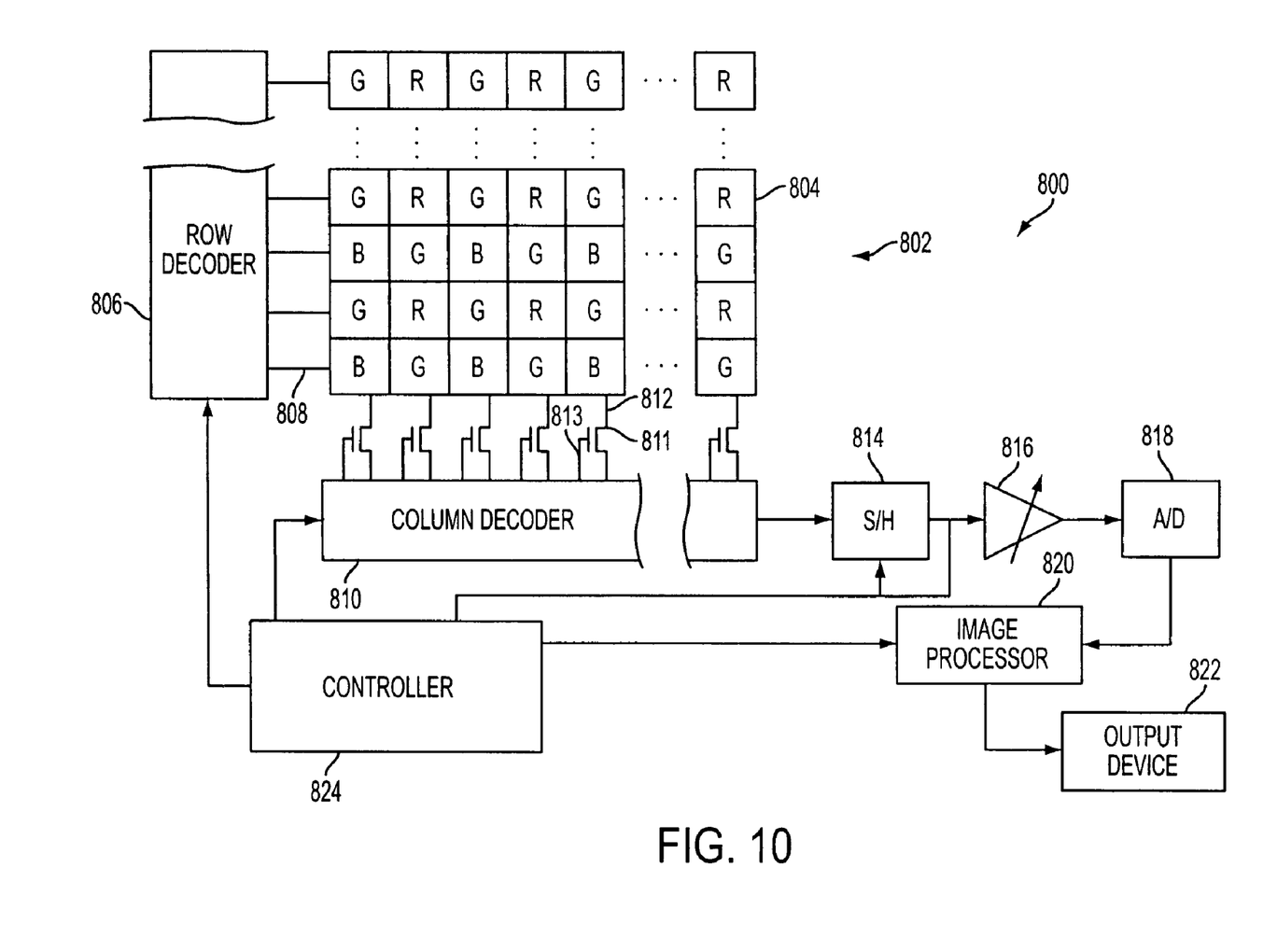
FIG. 10 is an example of an imaging apparatus incorporating the present invention.

An example of an imaging device incorporating the present invention is shown in FIG. 10. Specifically, an imaging apparatus 800 includes an image sensor 802 having a pixel array arranged according to a Bayer color filter pattern. A charge multiplying photoconversion layer such as a HARP layer is provided over each of the pixels in the array under the filter pattern. Each pixel 804 contains the protection and readout circuits in accordance with any one of the various embodiments discussed herein above.

The imaging apparatus 800 further includes a row decoder 806 including a plurality of row select activation lines 808 corresponding in number to the number of rows in the pixel array of the image sensor 802, wherein each line is connected to each row select switch in all the pixels in a respective row of the array. Similarly, column decoder 810 includes a plurality of column lines 812, the number of which corresponds to the number of columns in the pixel array of the image sensor 802. Each column line 812 is connected to the output sides of the row select switches in all the pixels in a respective column.

To read the image data obtained by the image sensor 802, controller 824 controls the row decoder 806 to sequentially activate the row select lines, whereby the row select switches for each pixel in a selected row is activated to thereby dump the image data from each respective pixel to the respective column line. Since each pixel in a row is connected to a different column line, the image data for each pixel is then read out to the image processor by sequentially activating all column select lines 813 to connect column lines 812 to column decoder 810 (via column select transistors 811). Thus, after activation of each row select line, the column select lines are sequentially activated to collect the image data in an orderly manner across the array.

Upon reading the image data out of the pixel array, the data is passed through a number of processing circuits which, in linear order, generally include a sample and hold circuit 814, an amplifier 816, an analog to digital converter 818, an image processor 820, and an output device 822.

Without being limiting, such the imaging apparatus 800 could be part of a computer system, camera system, scanner, machine vision system, vehicle navigation system, video telephone, surveillance system, auto focus system, star tracker system, motion detection system, image stabilization system and other systems requiring an imager.

Figure 11:
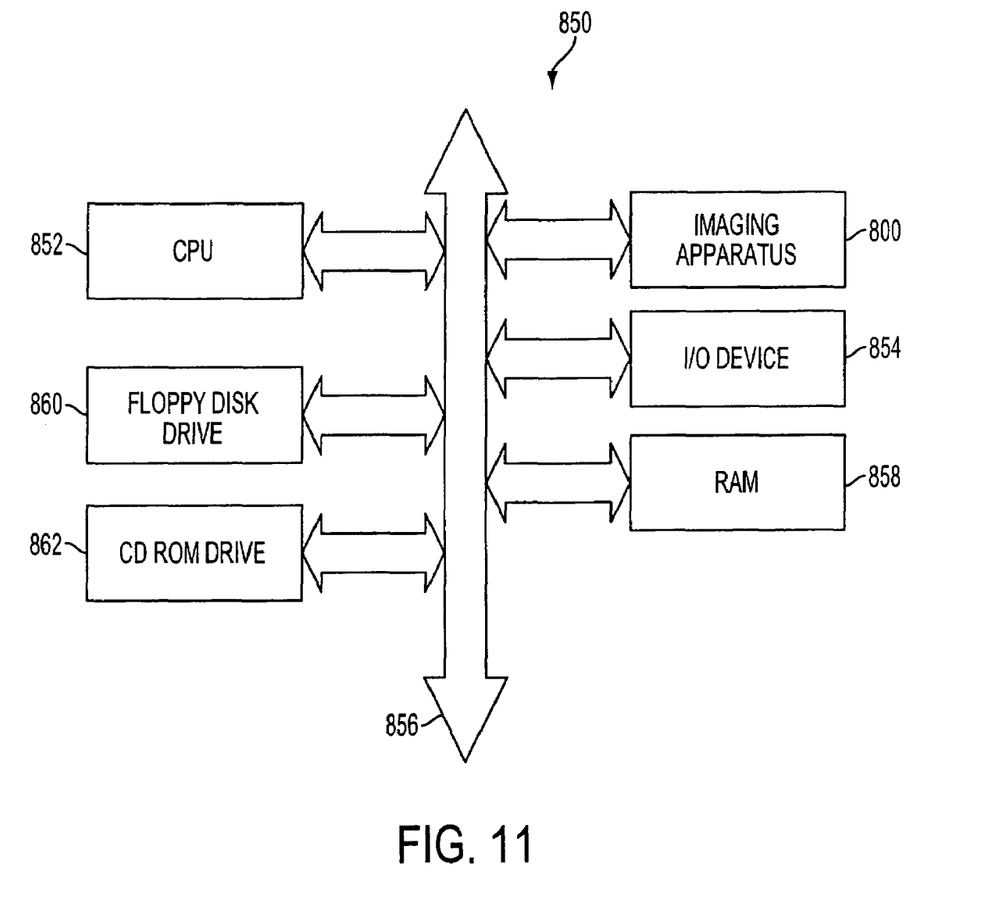
FIG. 11 is an illustration of a processing system communicating with the imaging apparatus of the present invention.

The imaging apparatus 800 may also be connected to a processor system 850, as shown in FIG. 11, such as a computer system. A processor system 850 generally comprises a central processing unit (CPU) 852 that communicates with an input/output (I/O) device 854 over a bus 856. The imaging apparatus 800 communicates with the system over bus 856 or a ported connection. The processor system 850 also includes random access memory (RAM) 858, and, in the case of a computer system, may include peripheral devices such as a floppy disk drive 860 and a compact disc (CD) ROM drive 862 which also communicate with CPU 852 over the bus 856.

Although the present invention has been described in relation to particular embodiments thereof, many other variations and modifications and other uses will become apparent to those skilled in the art. Therefore, the present invention is to be limited not by the specific disclosure herein, but only by the appended claims.

What is claimed as new and desired to be protected by Letters Patent of the United States is:

1. An image sensor comprising:
   a charge multiplying photoconversion layer; and
   an image sensor pixel array having a plurality of pixels, wherein each pixel comprises:
   a charge storage element electrically connected to the charge multiplying photoconversion layer at a first node, and
   a protection circuit electrically connected to the charge multiplying layer and the charge storage element at the first node and to a reference potential at a second node for limiting a voltage received from the charge multiplying layer which accumulates at the charge storage element to the reference potential,
   wherein said protection circuit and charge storage element are located within said pixel.

2. The image sensor according to claim 1, wherein the charge multiplying photoconversion layer is a high gain avalanche rushing amorphous photoconductor photoconversion layer.

3. The image sensor according to claim 1, wherein the storage element is a junction diode, the cathode of which is connected to the charge multiplying photoconversion layer.

4. The image sensor according to claim 1, wherein the storage element is a capacitor.

5. The image sensor according to claim 4, wherein the capacitor has a storage capacity of less than or equal to about 5 $fF/\mu^2$.

6. The image sensor according to claim 4, wherein the capacitor has a storage capacity in the range of 2-5 $fF/\mu^2$.

7. The image sensor according to claim 1, wherein the protection circuit includes a protection diode electrically connected to the storage element at the anode thereof and connected to the reference potential at the cathode thereof, whereby voltage accumulating at the storage element in excess of the reference potential is transferred away from the storage element through the protection diode.

8. The image sensor according to claim 7, wherein the storage element is a junction diode, the cathode of which is connected to the charge multiplying photoconversion layer.

9. The image sensor according to claim 7, wherein the storage element is a capacitor.

10. The image sensor according to claim 9, wherein the capacitor has a storage capacity of less than or equal to about 5 $fF/\mu^2$.

11. The image sensor according to claim 9, wherein the capacitor has a storage capacity in the range of 2-5 $fF/\mu^2$.

12. The image sensor according to claim 7, wherein the protection circuit further comprises a resistor electrically connected to the charge multiplying photoconversion layer and the storage element.

13. The image sensor according to claim 12, wherein the storage element is a junction diode, the cathode of which is connected to the charge multiplying photoconversion layer.

14. The image sensor according to claim 12, wherein the storage element is a capacitor.

15. The image sensor according to claim 14, wherein the capacitor has a storage capacity of less than or equal to about 5 $fF/\mu^2$.

16. The image sensor according to claim 14, wherein the capacitor has a storage capacity in the range of 2-5 $fF/\mu^2$.

17. The image sensor according to claim 1, wherein the protection circuit includes an n-MOS transistor having a drain and a gate both electrically connected to the storage element, and a source electrically connected to the reference potential, whereby voltage accumulating at the storage element in excess of the reference potential is transferred away from the storage element through the n-MOS transistor.

18. The image sensor according to claim 17, wherein the storage element is a junction diode, the cathode of which is connected to the charge multiplying photoconversion layer.

19. The image sensor according to claim 17, wherein the storage element is a capacitor.

20. The image sensor according to claim 19, wherein the capacitor has a storage capacity of less than or equal to about 5 fF/$\mu^2$.

21. The image sensor according to claim 19, wherein the capacitor has a storage capacity in the range of 2-5 fF/$\mu^2$.

22. The image sensor according to claim 17, wherein the protection circuit further comprises a resistor electrically connected to the charge multiplying photoconversion layer and the storage element.

23. The image sensor according to claim 22, wherein the storage element is a junction diode, the cathode of which is connected to the charge multiplying photoconversion layer.

24. The image sensor according to claim 22, wherein the storage element is a capacitor.

25. The image sensor according to claim 24, wherein the capacitor has a storage capacity of less than or equal to about 5 fF/$\mu^2$.

26. The image sensor according to claim 24, wherein the capacitor has a storage capacity in the range of 2-5 fF/$\mu^2$.

27. The image sensor according to claim 1, wherein each pixel further comprises an output circuit connected to the charge storage element.

28. The image sensor according to claim 27, wherein the output circuit includes a row select transistor which reads out a charge stored at the charge storage element.

29. A method for obtaining an image signal, comprising:

detecting a light signal in an image sensor;

photoconverting the light signal into an electrical signal in a photoconversion layer in the image sensor;

amplifying the electrical signal in the photoconversion layer;

transferring the electrical signal to a storage element at a first node;

accumulating charge from the electrical signal at the storage element; and limiting a voltage transferred from the photoconversion layer to the storage element to a reference potential using a protection circuit connected to the photoconversion layer and the storage element at the first node and to the reference potential at a second node wherein, said protection circuit and charge storage element are components located within a single imaging pixel.

30. The method according to claim 29, wherein limiting the voltage includes transferring charge away from the storage element when the voltage resulting from the accumulated charge exceeds the reference potential.

31. The method according to claim 30, wherein limiting the voltage further includes lowering the voltage of the electrical charge prior to the charge accumulating at the storage element.

32. The method according to claim 29, further comprising reading out the charge accumulated at the storage element.

33. The method according to claim 29, further comprising maintaining an effective operating voltage of the photoconversion layer at a constant level.

* * * * *

UNITED STATES PATENT AND TRADEMARK OFFICE
CERTIFICATE OF CORRECTION

PATENT NO. : 7,372,495 B2　　　　　　　　　　　　　　　　　　　　　　Page 1 of 1
APPLICATION NO. : 10/226190
DATED : May 13, 2008
INVENTOR(S) : Takayanagi et al.

It is certified that error appears in the above-identified patent and that said Letters Patent is hereby corrected as shown below:

In column 8, line 27, in Claim 3, delete "diode," and insert -- photodiode, --, therefor.

In column 8, line 45, in Claim 8, delete "diode," and insert -- photodiode, --, therefor.

In column 8, line 59, in Claim 13, delete "diode," and insert -- photodiode, --, therefor.

In column 9, line 9, in Claim 18, delete "diode," and insert -- photodiode, --, therefor.

In column 9, line 23, in Claim 23, delete "diode," and insert -- photodiode, --, therefor.

In column 10, line 18, in Claim 29, delete "node wherein," and insert
-- node, wherein --, therefor.

Signed and Sealed this

Twenty-ninth Day of September, 2009

David J. Kappos
*Director of the United States Patent and Trademark Office*